(12) United States Patent
Meisselbach et al.

(10) Patent No.: US 11,729,919 B2
(45) Date of Patent: Aug. 15, 2023

(54) CONTROLLER WITH INSERTABLE RADIO MODULE, AS WELL AS RADIO MODULE, COVER AND PLUG

(71) Applicant: Robert Bosch GmbH, Stuttgart (DE)

(72) Inventors: Alexander Meisselbach, Rieneck (DE); Joachim Neumann, Lohr (DE); Marco Genise, Wertheim (DE); Thomas Kison, Gemuenden (DE)

(73) Assignee: Robert Bosch GmbH, Stuttgart (DE)

( * ) Notice: Subject to any disclaimer, the term of this patent is extended or adjusted under 35 U.S.C. 154(b) by 394 days.

(21) Appl. No.: 16/514,335

(22) Filed: Jul. 17, 2019

(65) Prior Publication Data
US 2020/0029447 A1 Jan. 23, 2020

(30) Foreign Application Priority Data
Jul. 17, 2018 (DE) ..................... 10 2018 211 857.4

(51) Int. Cl.
*H05K 5/02* (2006.01)
*H05K 5/00* (2006.01)
*H05K 5/03* (2006.01)

(52) U.S. Cl.
CPC ......... *H05K 5/0017* (2013.01); *H05K 5/0217* (2013.01); *H05K 5/0247* (2013.01); *H05K 5/03* (2013.01)

(58) Field of Classification Search
CPC ...... H05K 5/0017; H05K 5/0217; H05K 5/03; H05K 5/0247; H04W 4/80
See application file for complete search history.

(56) References Cited

U.S. PATENT DOCUMENTS

| | | | | |
|---|---|---|---|---|
| 2002/0022459 A1* | 2/2002 | Kobayashi | ........... | H04B 1/3833 455/575.7 |
| 2013/0050035 A1* | 2/2013 | Kato | .................... | H01Q 1/2225 343/741 |
| 2014/0361933 A1* | 12/2014 | Zhang | .................... | H01Q 1/243 343/702 |
| 2016/0094261 A1* | 3/2016 | Yildirim | .............. | H04B 1/3888 455/90.1 |
| 2017/0040667 A1* | 2/2017 | Lee | ......... | H01Q 1/243 |
| 2017/0159897 A1* | 6/2017 | Paetz | ....................... | H04B 1/40 |
| 2018/0131086 A1* | 5/2018 | Frischke | ............... | H01Q 1/526 |
| 2018/0310436 A1* | 10/2018 | Egami | ............... | H01Q 21/0025 |
| 2018/0345474 A1* | 12/2018 | Brennenstuhl | ............ | B25F 5/02 |
| 2019/0223304 A1* | 7/2019 | Murray | ................ | H05K 5/0247 |

FOREIGN PATENT DOCUMENTS

| | | |
|---|---|---|
| DE | 10 2016 208 128 A1 | 6/2017 |
| EP | 1 881 249 A1 | 1/2008 |
| EP | 3 001 573 A1 | 3/2016 |
| EP | 3 299 044 A1 | 3/2018 |
| WO | 2011/033075 A1 | 3/2011 |
| WO | 2017/000728 A1 | 1/2017 |
| WO | 2017/100728 A1 | 6/2017 |

* cited by examiner

*Primary Examiner* — Jinhee J Lee
*Assistant Examiner* — Sagar Shrestha
(74) *Attorney, Agent, or Firm* — Maginot, Moore & Beck LLP

(57) ABSTRACT

An electronic controller includes a housing. The housing has an opening configured such that a radio module is removably insertable into the housing, and a cover and plug are also insertable into the housing.

7 Claims, 3 Drawing Sheets

CONTROLLER WITH INSERTABLE RADIO MODULE, AS WELL AS RADIO MODULE, COVER AND PLUG

This application claims priority under 35 U.S.C. § 119 to patent application no. DE 10 2018 211 857.4, filed on Jul. 17, 2019 in Germany, the disclosure of which is incorporated herein by reference in its entirety.

The disclosure relates to a controller, as well as a radio module, a cover, and a plug.

BACKGROUND

From EP 1 881 249 A1 there is known a valve assembly with a display device for valve information. The valve assembly is provided with a data transmission device for the transmittal of the valve information to a portable terminal device with the display device. The data transmission device according to one embodiment is designed as a transmission module for wireless transmission, especially for radio, infrared or Bluetooth signals. The transmission module here may be integrated in an electronics module, or the transmission module and the electronics module are formed separately, for example, arranged at the end side of the valve assembly. The data transmission device according to another embodiment has a data transmission cable for wireline transmission.

A user is thus restricted in having to choose between an electronics module without transmission module or an electronics module with integrated transmission module for the wireless transmission or an electronics module with integrated transmission module for wireline transmittal. If the user decides on a separate transmission module, it is limited in design space.

SUMMARY

The problem which the disclosure proposes to solve is to provide a data transmission with flexible applications for a controller. Special attention is given to the aspects of mass production and/or the typical requirements of fluidic engineering, such as high individualization of the product.

This problem is solved by an electronic controller with the features of the disclosure, a radio module with the features of the disclosure, a cover with the features of the disclosure, and a plug with the features of the disclosure.

A controller according to the disclosure comprises a control electronics for the actuating of a control object, especially a hydraulic valve, especially preferably a pressure valve and/or directional valve. For example, the control electronics may comprise at least one electronic regulator, at least one electronic amplifier and/or at least one other electronic component. The control electronics is arranged protected in a housing. Because a radio module can be inserted into at least one opening of the housing to produce an electrical connection, a suitable module can be chosen in a flexible manner, such as no module at all, the radio module, or a plug. At the same time, the chosen module is advantageously protected by the housing, similar to an integrated module, and it is advantageously connected electrically short. The opening is located at a preferably free side of the housing, such as a top, bottom, front, rear or lateral side. Inserting can also be understood as introducing, placing inside, shoving in, and/or some other mounting process. As a modification, the radio module can be fitted into the opening to achieve a vibration-free seating.

If the radio module can be taken out from the opening once more, such as being removable, extractable and/or dismountable, the user will have on the one hand a multiple flexible controller, since they can select a fitting module for the situation in an even more flexible manner. On the other hand, the user can make repeated use of the controller and/or the selected module in a cost-saving manner. Removal by especially preferable non-destructive or reversible breaking of the electrical connection is preferable here. Removal of a radio module can heighten the safety against unauthorized intrusion, or hacking.

According to one modification of the disclosure, the controller comprises contact surfaces which can be contacted through the opening, so that the electrical connection can be made in a mechanically-reliable and simple manner. The contact surfaces are configured to make the electrical connection (i.e., between the radio module and the control electronics). Preferably, they are configured and/or designed for data transmission, especially preferably for serial and/or parallel data transmission, and/or for current and/or voltage supply, such as by being dimensioned and/or coated for this. For example, the contact surfaces can be contacted through the opening when they are pointed towards the opening, by being oriented to an axis of the opening radially and/or axially. According to one exemplary embodiment, at least one carrier, such as a circuit board, for example a printed circuit board, is arranged in a prolongation of the axis of the opening, on whose top side at least one portion of the contact surfaces is accessible. In a modification, the contact surfaces are arranged at the bottom of the opening or at an axial end of the opening facing away from the mouth of the opening, while preferably the contact surfaces are placed as an abutment for the radio module to bear against, in order to enhance the vibration safety and the contact safety.

The contact surfaces may be designed for example as ring segments or curved elongated segments arranged on at least one circular path, or they may comprise such segments. This allows a limited rotational movement of the radio module with respect to the opening, for example, to the benefit of an installation by twisting and/or a position tolerance. A predetermined angular position of the radio module in an end position may be achieved in a reproducible and designed manner, for example, by using a slotted guide or the like.

According to another exemplary embodiment, a contact plate is formed in a recess of the housing, which can be configured as a continuous contact surface. The contact plate is connected by a cable to an interior of the housing, wherein an opening for the connection cable is configured between the recess and the interior in such a way that only the connection cable fits through it, i.e., its dimensioning is minimally small.

An especially protected housing is made at least in part from a metallic material, such as an alloy. In order to enable a wireless connection directly through an installed radio module, i.e., in a cost-saving manner without a separate antenna, at least one section bordering on an installation space for the radio module may contain or preferably consist of at least one radio wave permeable material. An especially favorable propagation of radio waves occurs when the radio wave permeable material encloses the installation space in a roughly hemispherical manner. Thus, according to one embodiment, the opening and/or the installation space can be defined by a cap secured on the preferably metallic base housing, so that the cap forms part of the housing. A cost-effective design is a plastic cap, i.e., a cap made from a plastic. The cap may be formed as a truncated cone on the outside and/or as a hollow cylinder on the inside, for example. When the radio module is arranged in the cap outside the metallic housing part in one preferred embodiment, the radio waves can be especially unobstructed.

According to one modification, a rotary closure is provided at the opening, for example concentric to it, being designed to lock an insert piece or the radio module. The rotary closure may for example be a screw closure or a bayonet closure. Advantageously, the rotary closure may be designed for the connecting to the cap and the closing of the opening.

Especially preferably, the controller is configured for the use of a radio module according to a wireless standard, especially a short-range wireless standard, especially preferably a Bluetooth standard. Thus, for example, a power/voltage supply of the radio module, the size of the installation space, a heat dissipation, an electromagnetic compatibility of the other electronics and/or in particular a radio wave permeability will be designed accordingly.

Also disclosed is a radio module for a controller, which is configured for being inserted into the opening of the above described controller, producing the electrical connection, and preferably also for the above described preferably non-destructive removal from the opening once more. A radio module according to the disclosure is therefore an insert piece, has flexible uses, can be chosen appropriate to the situation, and is preferably reusable in a cost-saving manner.

The radio module is preferably configured according to a wireless standard, especially a short-range wireless standard, especially preferably a Bluetooth standard. This enables an easily implemented connection to a transmission partner, such as a reading and/or writing or configuration device.

In accordance with the controller, the radio module in a further modification contains contact elements corresponding to the contact surfaces of the above described controller, i.e., contact elements which are diametrically opposed to the contact surfaces of the controller in regard to their position, number, dimensioning and/or choice of material. The contact elements may advantageously be telescopic spring pins which are pretensioned for an equalizing bearing against the contact surfaces, so that a mechanically secure electrical connection ensures a stable data transmission. The spring pins may be configured for data transmission, preferably for serial and/or parallel data transmission, and/or for current and/or voltage supply. According to one exemplary embodiment, the contact elements are placed on a bottom side of the radio module, i.e., on a side facing away from the opening in the installed position. According to an opposite exemplary embodiment, the "contact surfaces" of the controller can be spring pins of this kind, and the "contact elements" can be bearing surfaces corresponding to them. The spring pins should be dimensioned for contacting at least in the installed position.

According to a further exemplary embodiment, the radio module is formed on a circular carrier. The carrier is dimensioned such that it can be installed in the opening of the housing or the cap.

Moreover, the description of the controller may be applied to the radio module, as well as to the following insert pieces; thus, the described elements are each mutually compatible.

Also disclosed is a cover which is designed for tight closure, especially for sealing against environmental influences, of the opening of an above described controller. In this way, the opening interior or housing interior can be an installation space for electronics protected against dust, moisture, or other disturbing influences, for example. Thus, the cover is an insert piece.

The cover according to the disclosure may contain a radio module according to the disclosure, or the radio module according to the disclosure may be designed as a cover according to the disclosure. In this embodiment, the benefits of the radio module and the cover are synergistically combined.

Alternatively, the cover according to the disclosure and the radio module according to the disclosure are independent of each other, so that they can be easily designed and adapted without influencing each other. Once the cover is removed from the opening, the installation space of the radio module is freely accessible.

As a further alternative, the cover according to the disclosure and the radio module according to the disclosure may complement each other. For example, the cover may be designed to secure a radio module in the opening at the same time. The cover may for example secure the radio module by form fit axially and/or angularly with respect to the opening. In one preferred embodiment, the cover is secured at a defined angle by a bayonet lock, and the cover by engaging with the radio module establishes an angle position of the radio module such that the spring pins respectively contact a predetermined bearing surface. When the locked cover is positioned pressing against the radio module, the vibration security is improved.

According to another exemplary embodiment, the cover may have an oblong rectangular outer contour. The roughly rectangular outer contour may be provided with fillets both at the corners and on the long sides of the cover. An interior section of the cover is rounded accordingly for operative engagement with the opening. With such a design of the cover, it is easier for the user to grasp it.

Also disclosed is a plug, which is configured to be inserted into the opening of the above described controller producing the electrical connection with a cable, and preferably also for the above described, preferably non-destructive removal from the opening once more. The plug according to the disclosure is thus an insert piece. By means of the plug, a diagnostics or a parametrization in a production process can be implemented advantageously. The plug according to one embodiment has the same contact elements to the radio module, such as spring pins, for the contacting of the contact surfaces. The arrangement of the contact elements between the radio module and the plug can be the same, or the plug may also have more or fewer contact elements than the radio module, the arrangement of the functionally identical contact elements being preferably the same. For example, the plug may have only the spring pins for making an electrical connection for the serial data transmission, but not the spring pins for making an electrical connection for the voltage supply of the radio module.

Also disclosed are other insert pieces, such as a storage element and/or an expansion element. Moreover, a communication element is also disclosed which uses a wireless transmission other than radio, such as an optical transmission.

For protecting the controller against tampering, an insert piece, especially a cover with no radio module enclosed, can be secured by a lock on the housing side and/or the insert piece side.

Also disclosed are respectively a system containing a controller according to the disclosure and a radio module according to the disclosure, a system containing a controller according to the disclosure and a cover according to the disclosure, a system containing a controller according to the disclosure, a radio module according to the disclosure and a cover according to the disclosure, a system containing a controller according to the disclosure and a plug according to the disclosure, as well as a system containing a controller according to the disclosure and an insert piece according to the disclosure.

BRIEF DESCRIPTION OF THE DRAWINGS

Exemplary embodiments of the disclosure shall now be explained more closely with the aid of schematic drawings. There are shown.

DETAILED DESCRIPTION

Figure 1:
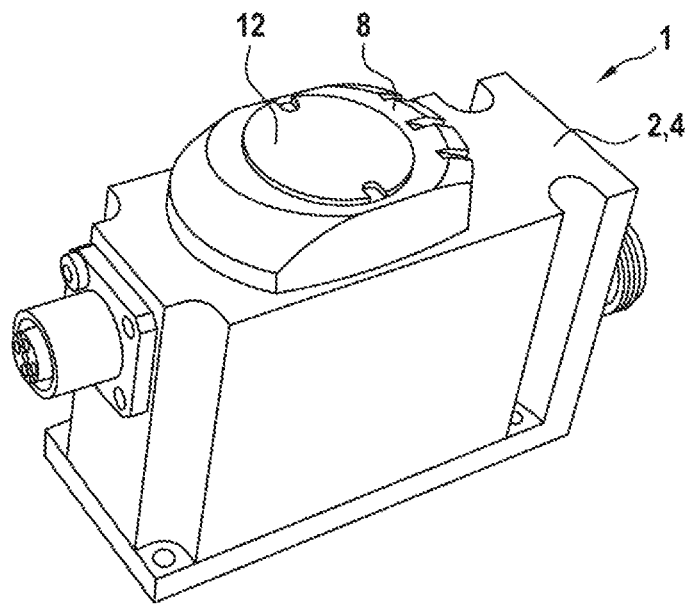
FIG. 1, a controller according to a first embodiment.

The controller 1 according to the disclosure shown in FIG. 1 contains an electronics, which is accommodated in a metallic housing section 2. The metallic housing section 2 has a top side 4. Through a recess 6 in the top side 4 of the metallic housing section 2, there is arranged a cap 8, which is a housing section. In turn, in this cap 8 there is made an opening 10, which is closed with a cover 12 according to the disclosure. The connection between the cap 8 and the cover 12 occurs by a screw closure or a kind of bayonet lock. The cap 8 and the cover 12 are made from a plastic permeable to radio waves.

Figure 2:
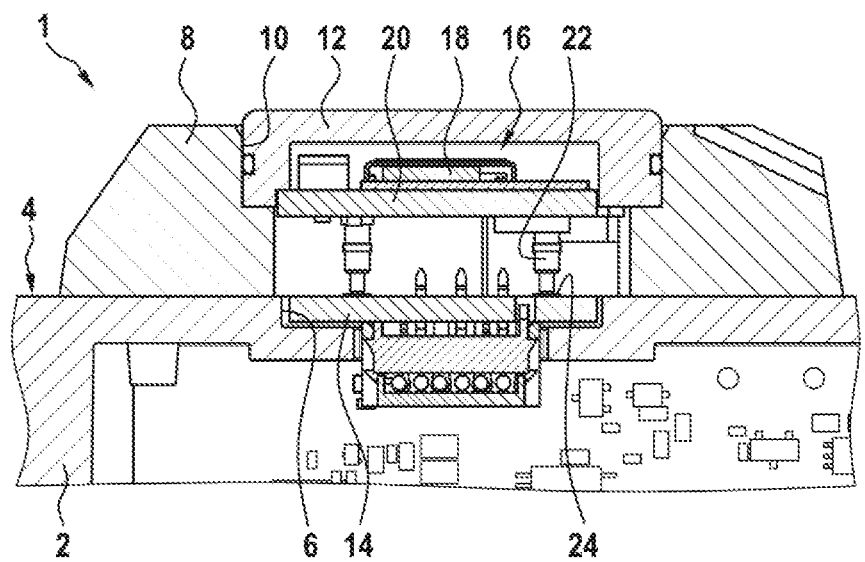
FIG. 2, a cross-section through the controller, a radio module and a cover according to the first embodiment, FIG. 3, a view of a detail of an electrical connection between the controller and the radio module according to the first embodiment, FIG. 4, a view of an electronics in the controller according to the first embodiment, FIG. 5, a controller according to a second embodiment, and FIG. 6, a cross-section through the controller, the radio module and the cover according to the second embodiment.

According to the cross-section of FIG. 2, the cap 8 is placed in a closing manner on the top side 4 of the metallic housing section 2. It can be seen in the center of FIG. 2 that the recess 6 accommodates the metallic housing section 2 on the top side 4 of the metallic housing section 2. A circuit board 14 is placed embedded in this recess 6. A Bluetooth module, designated overall as 16 and being a radio module according to the disclosure, is arranged in the opening 10. The Bluetooth module 16 contains a Bluetooth chip 18, which is arranged on a carrier 20 adapted in circular shape to the shape of the opening 10. On one side facing towards the circuit board 14, spring pins 22 protrude from the carrier 20. The spring pins 22 are the contact elements of the Bluetooth module 16.

Figure 3:
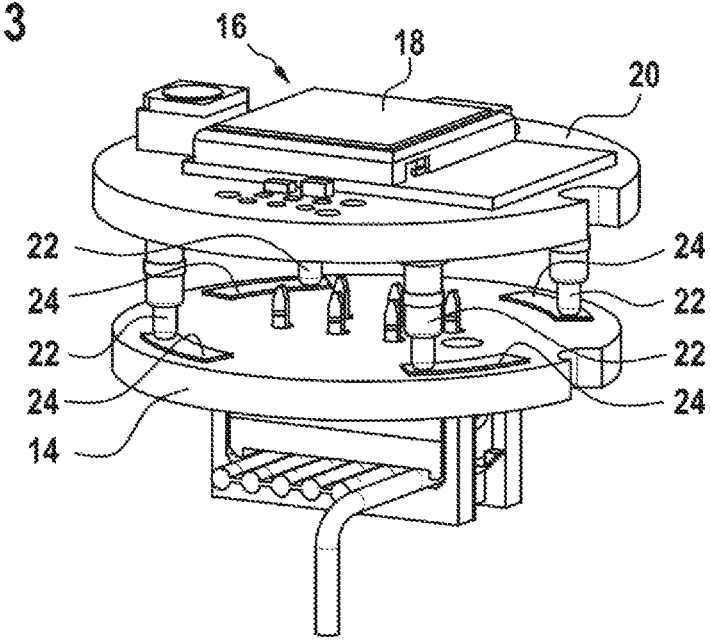

FIG. 3 shows the contacting of the likewise circular circuit board 14 with the Bluetooth module 16. The spring pins 22 passing through the carrier 20 are connected to contact surfaces 24 of the circuit board 14 shaped as ring segments.

In the present exemplary embodiment, the Bluetooth module 16 is arranged such that it is located inside the cap 8, yet distinctly outside the metallic housing section 2. Such an arrangement produces a good signal strength, affected little if at all by the metallic housing section 2. Furthermore, a changing or replacement of the Bluetooth module 16 is simplified by the arrangement outside the metallic housing 2. By removing the cover 12 from the cap 8, one has direct access to the Bluetooth module 16. Thus, the Bluetooth module 16 can be easily removed from the circuit board 14 through the opening and out from the cap 8.

Figure 4:
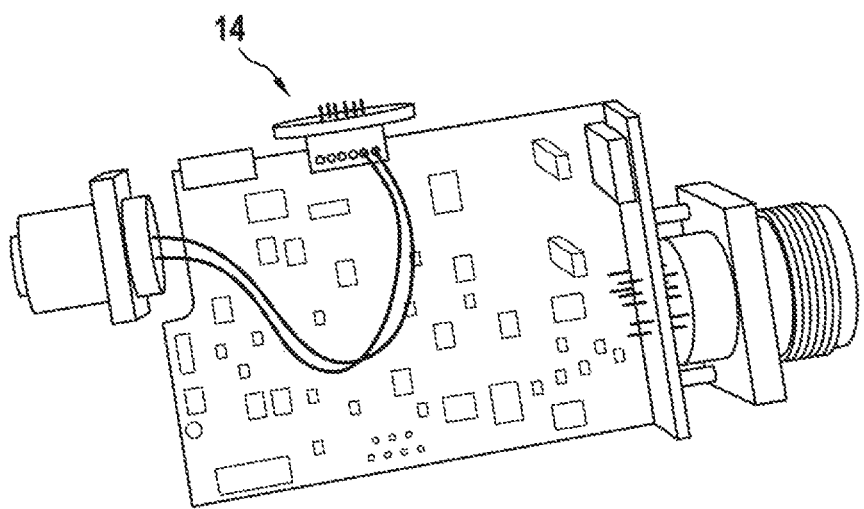

As shown in FIG. 4, the electronics comprises a plurality of electronic components, which are connected to the circuit board for example via an internal wiring.

Figure 5:
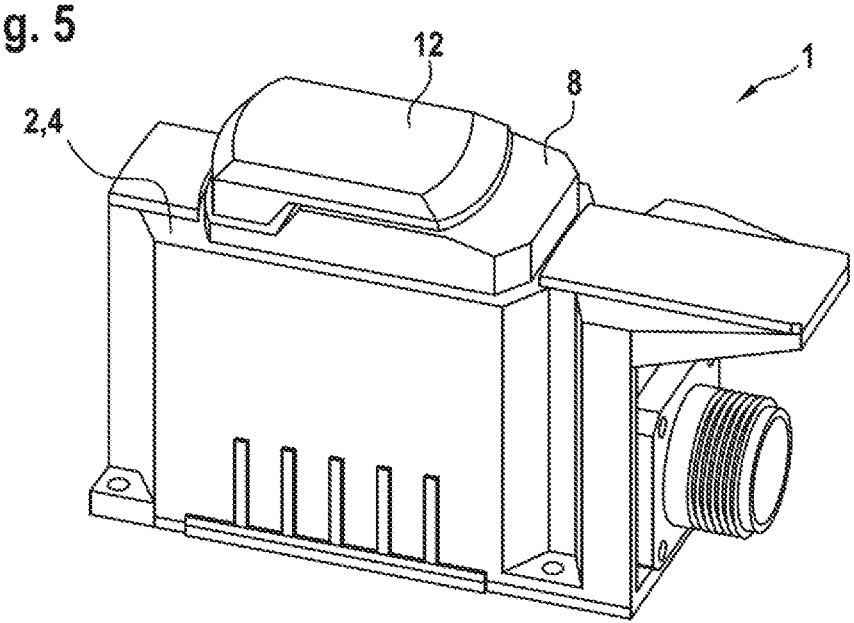

FIG. 5 shows a controller 1 in a second exemplary embodiment. The basic shape of the housing 2 is largely unchanged from the preceding exemplary embodiment, while the cap 8 and the cover 12 have an altered configuration. Along a longitudinal direction of the housing 2, the cap 8 is formed on one side 4, being elongated along this longitudinal direction. The cover 12 in keeping with the cap 8 is likewise elongated in configuration and has a rectangular outer contour with rounded edges and sides. A kind of luminous band (not shown) can be introduced circumferentially in a fillet of the side of the cover 12 facing away from the housing 2, putting out an optical signal to the user, for example as to the status of the control electronics.

Figure 6:
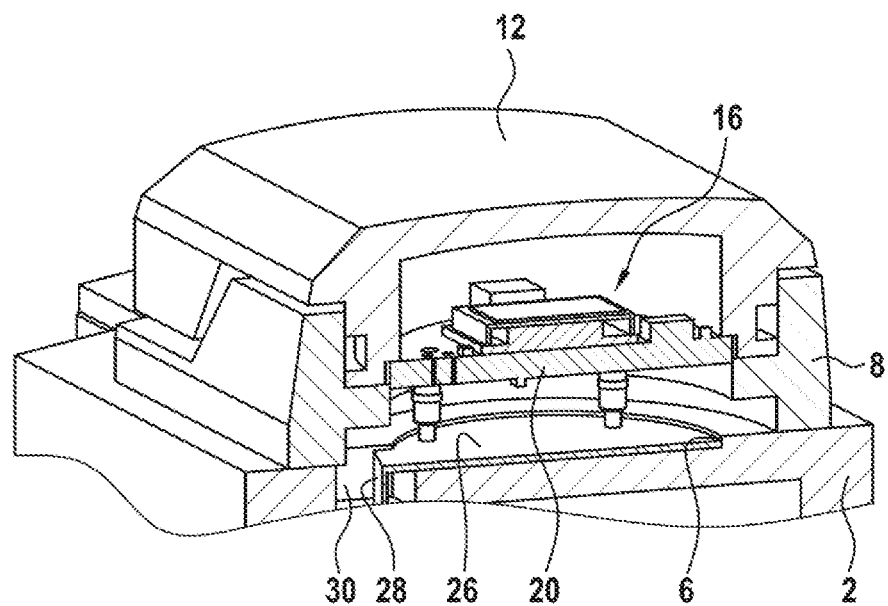

FIG. 6 shows a cross-sectional representation of the second exemplary embodiment. In the recess 6 of the metallic housing section 2, there is arranged a contact plate 26. Such a contact plate 26 may be configured as a "Flexprint" circuit board. As compared to the first exemplary embodiment, the recess 6 is not pierced centrally for a plug-in connection with respect to the metallic housing section 2, but instead has an opening 30 situated in a margin region, which is configured to be so small that a connection cable 28 can be led through this opening 30 into the metallic housing section. This connection cable 28 can be designed as a "Flexprint" cable. The contact plate 26 in the present exemplary embodiment has the function of the circuit board 14 of the first exemplary embodiment. Accordingly, the contact plate 26 is circular. The opening 10 of the cap 8, the carrier 20 which carries the Bluetooth module 16, and an inner contour of the cover 12 are likewise circular or rounded in this exemplary embodiment.

Of course, the second exemplary embodiment may be combined with the first embodiment, so that the contact plate 26 may also be used in place of the circuit board 14 and vice versa.

According to a further embodiment, not shown, the contact surfaces 24 of the circuit board 14, after the Bluetooth module 16 has been removed from the opening 10, may be used as an interface for a wireline diagnostics or service unit. Such a plug would likewise be circular in shape, so that its base surface, as well as its contact units, would match up with those of the carrier 20 and the spring pins 22.

There is disclosed an electronic controller 1 having a housing 2, 8, wherein a radio module 16, such as a Bluetooth module, is insertable in an opening 10 of the housing 2, 8 and preferably is removable again. Moreover, a radio module 16 insertable in the opening 10, a cover 12 insertable therein, and a plug insertable therein.

What is claimed is:

1. An electronic controller, comprising:
a housing including a side having an opening, said housing including a metallic section formed from a metallic material and a permeable section formed from a radio wave permeable material, the permeable section defining an installation space in communication with said opening;
control electronics positioned in the metallic section of the housing;
wherein the opening is configured such that a radio module is insertable through the opening into said installation space so as to form an electrical connection with the control electronics positioned in the metallic section of the housing;

one or more contact surfaces configured and arranged such that the one or more contact surfaces are contactable with the radio module via the opening; and a contact plate that includes the one or more contact surfaces, wherein the one or more contact surfaces are flat.

2. The electronic controller of claim 1, wherein the electronic controller is configured such that the radio module, when inserted into the opening, is removable via the opening.

3. The electronic controller of claim 1, further comprising:

a cover configured to form a tight closure of the opening.

4. The electronic controller of claim 3, wherein the cover is further configured to secure the radio module in the opening when the radio module is inserted into the opening.

5. The electronic controller of claim 4, wherein the cover includes:

a substantially circular or rounded section configured such that the radio module is insertable in the section; and an oblong section having a substantially rectangular outer contour.

6. The electronic controller of claim 1, further comprising:

a plug configured so as to be insertable into the opening, and further configured to form the electrical connection via a cable.

7. An electronic controller, comprising:

a housing including a side having an opening, said housing including a metallic section formed from a metallic material and a permeable section formed from a radio wave permeable material, the permeable section defining an installation space in communication with said opening; and control electronics positioned in the metallic section of the housing;

wherein the opening is configured such that a radio module is insertable through the opening into said installation space so as to form an electrical connection with the control electronics positioned in the metallic section of the housing, and wherein the electronic controller is configured to actuate a hydraulic valve.

* * * * *